(12) United States Patent
Streppel

(10) Patent No.: US 12,001,098 B2
(45) Date of Patent: Jun. 4, 2024

(54) LED BACKLIGHTING SYSTEM

(71) Applicant: OSRAM Opto Semiconductors GmbH, Regensburg (DE)

(72) Inventor: Ulrich Streppel, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 17/641,368

(22) PCT Filed: Nov. 3, 2020

(86) PCT No.: PCT/EP2020/080802
§ 371 (c)(1),
(2) Date: Mar. 8, 2022

(87) PCT Pub. No.: WO2021/104806
PCT Pub. Date: Jun. 3, 2021

(65) Prior Publication Data
US 2024/0045265 A1 Feb. 8, 2024

(30) Foreign Application Priority Data

Nov. 25, 2019 (DE) ............. 10 2019 218 203.8

(51) Int. Cl.
*G02F 1/00* (2006.01)
*G02F 1/1335* (2006.01)
*G02F 1/13357* (2006.01)

(52) U.S. Cl.
CPC .. *G02F 1/133605* (2013.01); *G02F 1/133603* (2013.01); *G02F 1/133607* (2021.01)

(58) Field of Classification Search
None
See application file for complete search history.

(56) References Cited

U.S. PATENT DOCUMENTS

2012/0086875 A1* 4/2012 Yokota ............. G02F 1/133605
348/790
2012/0236213 A1* 9/2012 Shimizu ............ G02F 1/133603
362/249.02

(Continued)

FOREIGN PATENT DOCUMENTS

EP 3447807 A1 2/2019
GB 2544895 A 5/2017
WO 2018185476 A1 10/2018

OTHER PUBLICATIONS

International Search Report for International Patent Application No. PCT/EP2020/080802, dated Feb. 10, 2021 (5 pages).

*Primary Examiner* — Gerald J Sufleta, II
(74) *Attorney, Agent, or Firm* — ARENTFOX SCHIFF LLP

(57) ABSTRACT

The present invention relates to an LED backlighting system comprising a substrate, an optoelectronic semiconductor chip assembly, a reflector and a diffuser element. The optoelectronic semiconductor chip assembly is disposed on an upper side of the substrate. The reflector has a through-hole that extends between a lower opening on an underside of the reflector and an upper opening on an upper side of the reflector. The reflector is disposed on the upper side of the substrate so that the underside of the reflector is facing the upper side of the substrate. The optoelectronic semiconductor chip assembly is disposed in the through-hole of the reflector. The diffuser element has an upper side and an underside. The diffuser element is disposed above the upper side of the reflector so that the underside of the diffuser element is facing the upper side of the reflector.

13 Claims, 15 Drawing Sheets

(56) References Cited

U.S. PATENT DOCUMENTS

| | | | |
|---|---|---|---|
| 2015/0188010 A1* | 7/2015 | Kim | H01L 33/486 |
| | | | 257/98 |
| 2015/0233534 A1* | 8/2015 | Kaiser | H01L 25/13 |
| | | | 250/234 |
| 2019/0129249 A1* | 5/2019 | Lee | G09G 3/36 |
| 2020/0124834 A1* | 4/2020 | Woodgate | G02F 1/133603 |
| 2021/0072595 A1* | 3/2021 | Robinson | G02F 1/133603 |
| 2021/0116101 A1* | 4/2021 | Oh | G02F 1/133605 |

* cited by examiner

LED BACKLIGHTING SYSTEM

The present invention relates to an LED backlighting system.

This patent application is a 35 U.S.C. § 371 National Phase of PCT Application No. PCT/EP2020/080802, filed on Nov. 3, 2020, which claims priority to German patent application no. 102019 218 203.8, filed Nov. 25, 2019, the disclosures of which are hereby incorporated by reference herein in their entireties.

Backlighting systems are known from the prior art and are used in liquid crystal screens, for example. It is known to use light emitting diodes as a light source in backlighting systems. It is known to arrange the light emitting diodes in planar fashion as a matrix in such LED backlighting systems.

An object of the present invention consists in providing an LED backlighting system. This object is achieved by means of an LED backlighting system having the features of the independent patent claim. Various developments are specified in the dependent claims.

An LED backlighting system comprises a carrier, an optoelectronic semiconductor chip arrangement, a reflector and a diffuser element. The optoelectronic semiconductor chip arrangement is arranged at a top side of the carrier. The reflector has a through opening extending between a lower opening at an underside of the reflector and an upper opening at a top side of the reflector. The reflector is arranged at the top side of the carrier, wherein the underside of the reflector faces the top side of the carrier. The optoelectronic semiconductor chip arrangement is arranged in the through opening of the reflector. The diffuser element has a top side and an underside. The diffuser element is arranged over the top side of the reflector in such a way that the underside of the diffuser element faces the top side of the reflector.

Advantageously, this LED backlighting system can be embodied with a small thickness. In this case, the reflector and the diffuser element arranged over the reflector bring about a good homogeneity of the light emitted by the LED backlighting system and at the same time ensure only low crosstalk between unit cells of the LED backlighting system. This advantageously enables local dimming of individual regions of the LED backlighting system.

In one embodiment of the LED backlighting system, the lower opening of the reflector has a circular disk shape, an elliptic shape or a cushion shape. In this case, the lower opening of the reflector can be dimensioned so as to result in only a small distance between the edge of the lower opening of the reflector and the optoelectronic semiconductor chip arrangement arranged in the through opening of the reflector. What is advantageously achieved as a result is that in the vicinity of the optoelectronic semiconductor chip arrangement only a small area of the top side of the carrier remains in a manner not covered by the reflector. An asymmetrical emission of the reflector can be achieved by means of an asymmetrical shaping of the lower opening of the reflector.

In one embodiment of the LED backlighting system, the upper opening of the reflector has a cushion shape or a square shape. In this case, the upper opening has rounded corners. Advantageously, the cushion shape or square shape of the upper opening of the reflector is well suited for a matrix-shaped arrangement of a plurality of unit cells of the LED backlighting system. In this case, the reflector converts the shape of the lower opening into the shape of the upper opening. In this case, the reflector can be embodied such that the through opening of the reflector converts the shape of the lower opening into the shape of the upper opening without sharp edges or bends. This is also supported by the rounded corners of the upper opening.

In one embodiment of the LED backlighting system, the reflector has at its top side a peripheral edge extending around the upper opening, and at least one spacer arranged at the peripheral edge. In this case, the diffuser element bears against the spacer, thus resulting in an air gap between the peripheral edge of the reflector and the underside of the diffuser element. What is advantageously achieved by the air gap between the reflector and the diffuser element is that light emitted by the optoelectronic semiconductor chip arrangement can pass laterally right over the peripheral edge of the reflector and, as a result, no shaded regions arise between the unit cells of the LED backlighting system. The arrangement of the diffuser element at the spacer of the reflector advantageously constitutes a simple and reliable mechanical solution for exact relative positioning of the reflector and the diffuser element.

In one embodiment of the LED backlighting system, the diffuser element has a center axis defined by a central point of the top side and a central point of the underside. In this case, a thickness of the diffuser element measured between the underside of the diffuser element and the top side of the diffuser element parallel to the center axis has different values in different regions of the diffuser element. The portions of the diffuser element having different thicknesses bring about a locally different diffuser effect of the diffuser element. This locally different diffuser effect can compensate for locally different intensities of the light emerging at the upper opening of the reflector and, as a result, achieve a high homogeneity of the light emitted by the LED backlighting system.

In one embodiment of the LED backlighting system, the thickness of the diffuser element has a smaller value at a location along a side center plane than at the center axis of the diffuser element. Advantageously, this configuration of the diffuser element brings about an effective homogenization of the light emitted by the LED backlighting system.

In one embodiment of the LED backlighting system, the thickness of the diffuser element has a larger value at a location along a diagonal plane than at a center axis of the diffuser element. Advantageously, it is thereby possible to compensate for the situation if the light emerging at the upper opening of the reflector has a particularly high luminance in the regions along the diagonal plane.

In one embodiment of the LED backlighting system, the underside of the diffuser element is embodied as a freeform surface. In this case, the locally different thickness of the diffuser element is at least partly attained by the configuration of the underside of the diffuser element.

In one embodiment of the LED backlighting system, the top side of the diffuser element is embodied as a plane surface. Advantageously, further components of the LED backlighting system, for example a film stack, can then be arranged at the top side of the diffuser element in a simple manner. However, it is also possible for the top side of the diffuser element to be embodied as a freeform surface in order to at least partly attain the locally different thickness of the diffuser element by the configuration of the top side of the diffuser element. In this case, the underside of the diffuser element can optionally likewise be embodied as a freeform surface or as a plane surface.

In one embodiment of the LED backlighting system, the diffuser element has the same symmetry as the reflector. If the reflector has a quadrant symmetry, for example, then the diffuser element also has such a quadrant symmetry. If the reflector has only a mirror symmetry, for example, then the diffuser element is also embodied mirror-symmetrically. Advantageously, a particularly good homogenization of the light emitted by the LED backlighting system is achieved by the shape of the reflector and the shape of the diffuser element being coordinated with one another in such a way.

In one embodiment of the LED backlighting system, the underside of the diffuser element has a peripheral edge bearing on the top side of the reflector. Advantageously, this results in a particularly simple and mechanically reliable arrangement of the diffuser element at the top side of the reflector.

In one embodiment of the LED backlighting system, the diffuser element comprises embedded diffuser particles, in particular diffuser particles comprising $Al_2O_3$, $TiO_2$ or $SiO_2$. Advantageously, embedding such diffuser particles into the diffuser element has proved to be particularly effective.

In one embodiment of the LED backlighting system, the LED backlighting system comprises a film stack arranged at the top side of the diffuser element. The film stack can bring about for example a polarization of the light emitted by the LED backlighting system. In this case, the film stack can be embodied such that light which does not have the desired polarization direction is not lost, but rather recycled. As a result, the LED backlighting system can advantageously have a particularly high efficiency.

In one embodiment of the LED backlighting system, the optoelectronic semiconductor chip arrangement has a top side, an underside and a plurality of side surfaces. In this case, the optoelectronic semiconductor chip arrangement is configured to emit at least 50% of an emitted light power at the side surfaces, preferably at least 80%. Advantageously, a particularly high homogenization of the light emitted by the LED backlighting system is achieved as a result.

In one embodiment of the LED backlighting system, the optoelectronic semiconductor chip arrangement comprises an optoelectronic semiconductor chip. In this case, the optoelectronic semiconductor chip is embedded into a wavelength-converting material forming the side surfaces of the optoelectronic semiconductor chip arrangement. A primary reflector is arranged at a top side of the wavelength-converting material and forms the top side of the optoelectronic semiconductor chip arrangement. Advantageously, the primary reflector of this optoelectronic semiconductor chip arrangement brings about a desired high lateral emission of the optoelectronic semiconductor chip arrangement.

In one embodiment of the LED backlighting system, the reflector together with further reflectors of identical type forms a continuous reflector assemblage. The diffuser element together with further diffuser elements of identical type forms a continuous diffuser assemblage. Here in each case a further optoelectronic semiconductor chip arrangement of identical type is arranged in the through opening of each further reflector. As a result, the LED backlighting system comprises a plurality of unit cells embodied in an identical fashion. The unit cells can be arranged in a regular matrix arrangement, for example. Advantageously, the LED backlighting system can thereby be scaled to the desired size and can emit light with good homogeneity over the entire area.

The above-described properties, features and advantages of this invention and the way in which they are achieved will become clearer and more clearly understood in association with the following description of the exemplary embodiments which are explained in greater detail in association with the drawings. Here in each case in a schematic illustration:

FIG. 1 shows a schematic sectional side view of a part of an LED backlighting system 10. The LED backlighting system can be used for example for backlighting in a liquid crystal screen or some other liquid crystal display.

Figure 1:
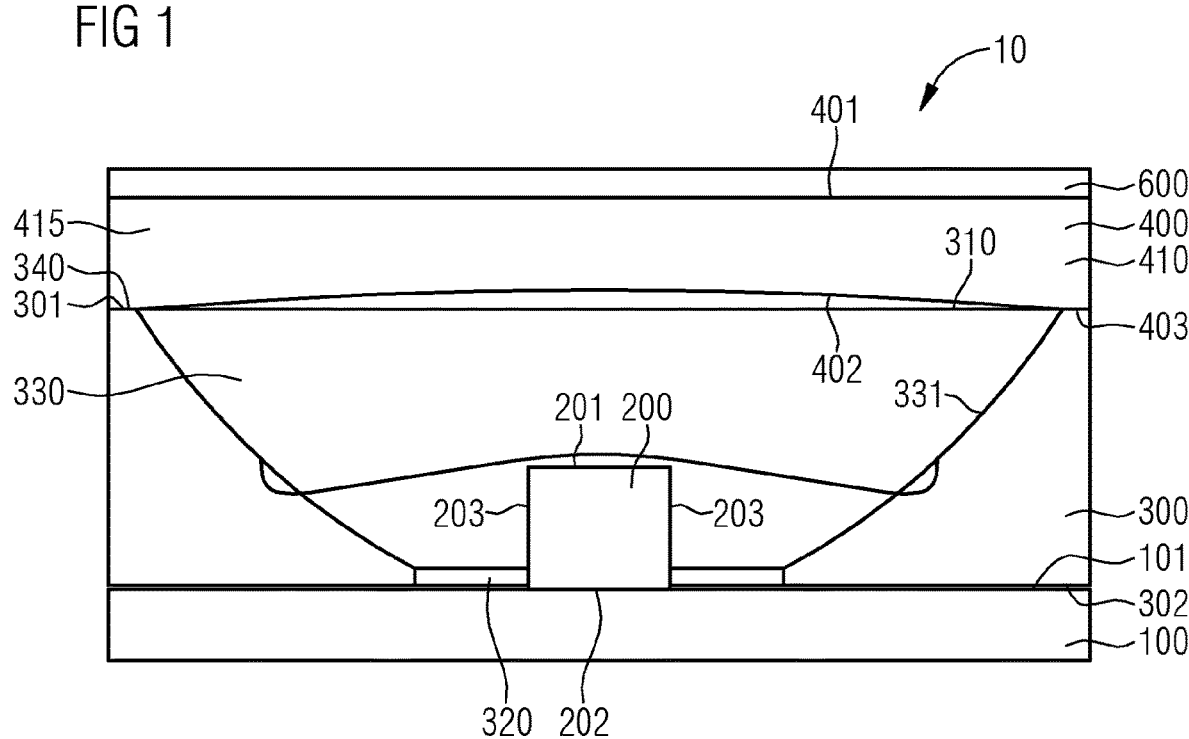
FIG. 1 shows a sectional side view of a first LED backlighting system.

That part of the LED backlighting system 10 which is shown in the schematic illustration in FIG. 1 can be referred to as a unit cell of the LED backlighting system 10. The LED backlighting system 10 can comprise a plurality of such unit cells. In this case, the unit cells can be arranged in a regular matrix arrangement.

The LED backlighting system 10 comprises a carrier 100 having a top side 101. The carrier 100 can be embodied as a printed circuit board (PCB), for example.

Figure 2:
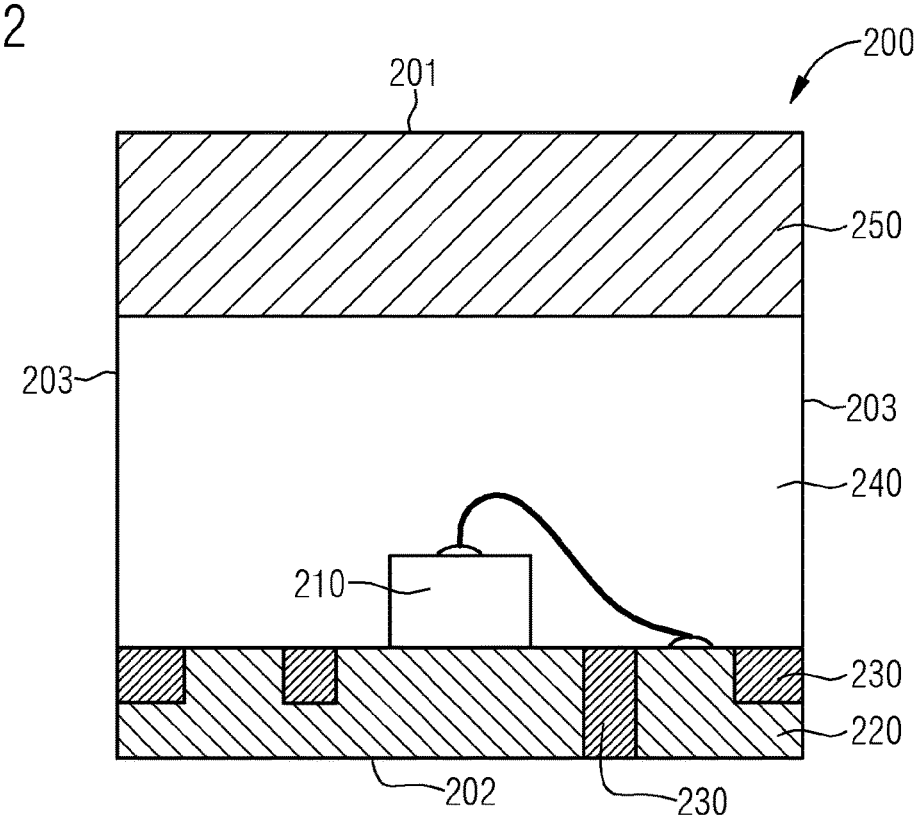
FIG. 2 shows a sectional side view of an optoelectronic semiconductor chip arrangement of the LED backlighting system.

The LED backlighting system 10 furthermore comprises an optoelectronic semiconductor chip arrangement 200. The optoelectronic semiconductor chip arrangement 200 is illustrated in a greatly simplified manner in FIG. 1. FIG. 2 shows a more detailed schematic sectional side view of the optoelectronic semiconductor chip arrangement 200.

The optoelectronic semiconductor chip arrangement 200 has an approximately parallelepipedal basic shape having a top side 201, an underside 202 opposite the top side 201, and a plurality of side surfaces 203 extending between top side 201 and underside 202.

The underside 202 of the optoelectronic semiconductor chip arrangement 200 is formed by a leadframe 220. The leadframe 220 can have a plurality of portions that are electrically insulated from one another, which is illustrated merely schematically in FIG. 2. An underside of the leadframe 220 forms the underside 202 of the optoelectronic semiconductor chip arrangement 200.

An optoelectronic semiconductor chip 210 is arranged at a top side of the leadframe 220. The optoelectronic semiconductor chip 210 is electrically conductively connected to the leadframe portions of the leadframe 220, for example via a bond connection, an electrically conductive adhesive connection and/or via bond wires. The optoelectronic semiconductor chip 210 is configured to emit electromagnetic radiation, for example light having a blue, violet, ultraviolet or other light color. The optoelectronic semiconductor chip 210 can be embodied as a light emitting diode chip (LED chip), for example.

In the regions surrounding the optoelectronic semiconductor chip 210, a potting material 230 is arranged at the top side of the leadframe 220. The leadframe 220 can be embedded into the potting material 230. It is expedient if the potting material 230 has a high reflectivity. By way of example, the potting material 230 can have a white color. The potting material 230 can be omitted in a simplified embodiment.

A wavelength-converting material 240 is arranged over the leadframe 220 of the optoelectronic semiconductor chip arrangement 200. The optoelectronic semiconductor chip 210 is embedded into the wavelength-converting material 240. The wavelength-converting material 240 forms the side surfaces 203 of the optoelectronic semiconductor chip arrangement 200. The wavelength-converting material 240 is configured to at least partly convert light emitted by the optoelectronic semiconductor chip 210 into light having a different wavelength. The wavelength-converting material 240 can be configured for example to convert light emitted by the optoelectronic semiconductor chip 210 into white light. The wavelength-converting material 240 can comprise a matrix material and wavelength-converting particles embedded into the matrix material. The matrix material can be for example a silicone or an epoxy.

A primary reflector 250 is arranged over the wavelength-converting material 240 and forms the top side 201 of the optoelectronic semiconductor chip arrangement 200. The primary reflector 250 is provided for reflecting light that has been emitted by the optoelectronic semiconductor chip 210 and converted in the wavelength-converting material 240, such that only a small portion of this light emerges through the top side 201 of the optoelectronic semiconductor chip arrangement 200. A main portion of the light generated by the optoelectronic semiconductor chip arrangement 200 emerges through the side surface 203 of the optoelectronic semiconductor chip arrangement 200. It is expedient if at least 50% of the emitted luminous power is emitted at the side surfaces 203. It is particularly expedient if even at least 80% of the luminous power is emitted at the side surfaces 203.

Figure 3:
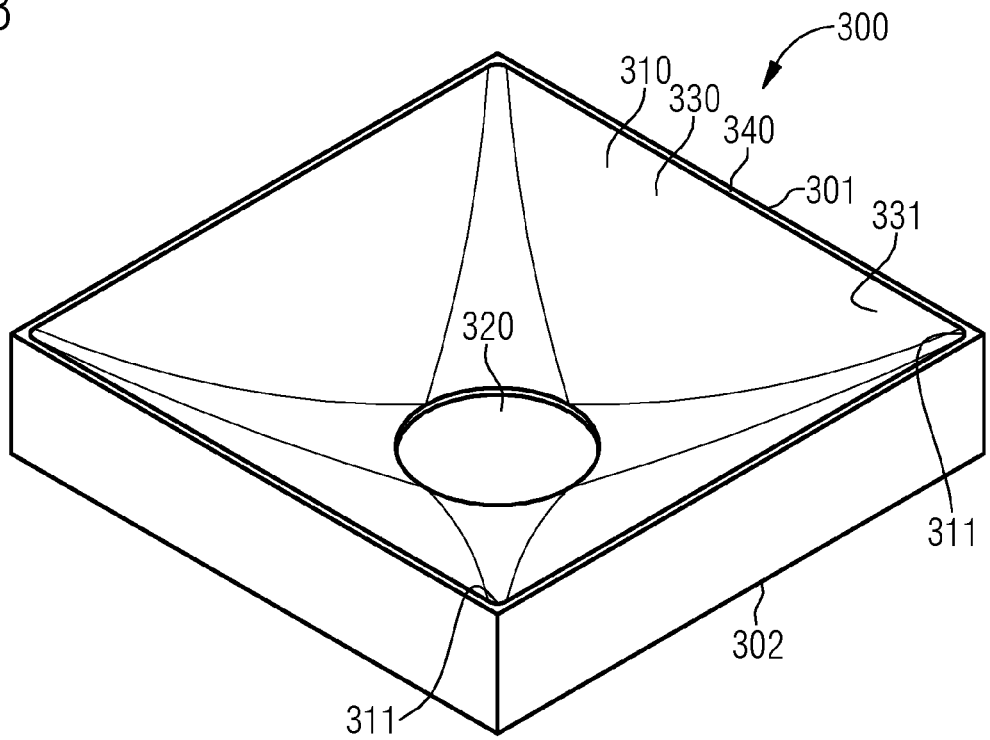
FIG. 3 shows a perspective illustration of a reflector of the LED backlighting system.

FIG. 1 reveals that the LED backlighting system 10 comprises a reflector 300 having the basic shape of a parallelepiped and having a top side 301 and an underside 302 opposite the top side. FIG. 3 shows a schematic perspective illustration of the reflector 300 without the remaining components of the LED backlighting system 10.

The reflector 300 has a through opening 330 extending between the underside 302 and the top side 301. The through opening 330 has an upper opening 310 at the top side 301. The through opening 330 has a lower opening 320 at the underside 302. The through opening 330 thus extends from the lower opening 320 arranged at the underside 302 to the upper opening 310 arranged at the top side 301. The upper opening 310 is larger than the lower opening 320, such that the through opening 330 widens in a funnel-shaped manner from the lower opening 320 to the upper opening 310. The upper opening 310 is so large that only a narrow peripheral edge 340 remains at the top side 301 of the reflector 300. The upper opening 310 thus occupies almost the entire top side 301 of the reflector 300.

A wall 331 of the through opening 330 forms a reflective mirror surface. It is expedient if the wall 331 has a high reflectivity, for example a reflectivity of more than 80%. For this purpose, the reflector 300 can be embodied from a white material, for example. It is expedient if the wall 331 of the through opening 330 of the reflector 300 effects Lambertian scattering. A specular portion of the reflection of up to 30% is expedient.

Figure 4:
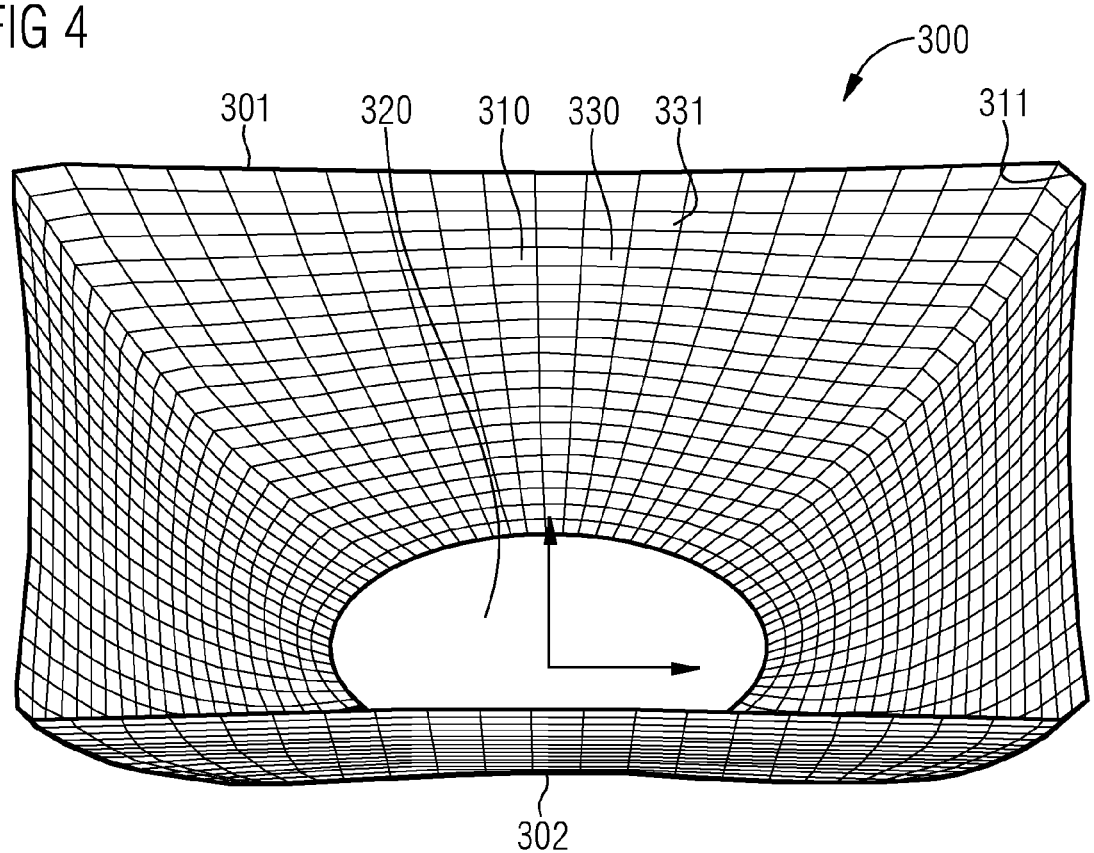
FIG. 4 shows an illustration of a wall of a through opening of the reflector.
Figure 5:
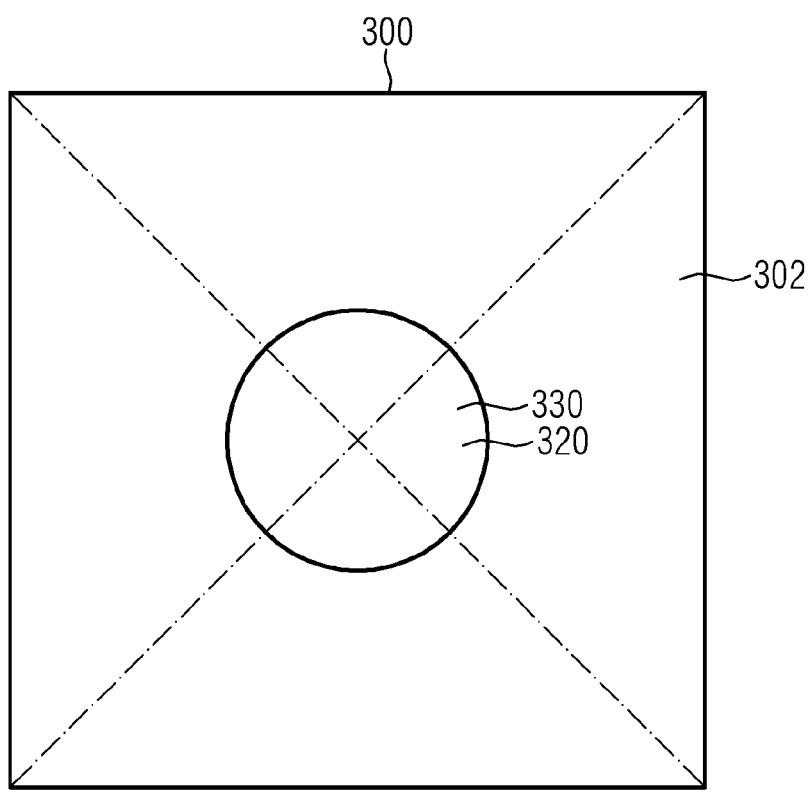
FIG. 5 shows a plan view of a lower opening of the reflector.
Figure 6:
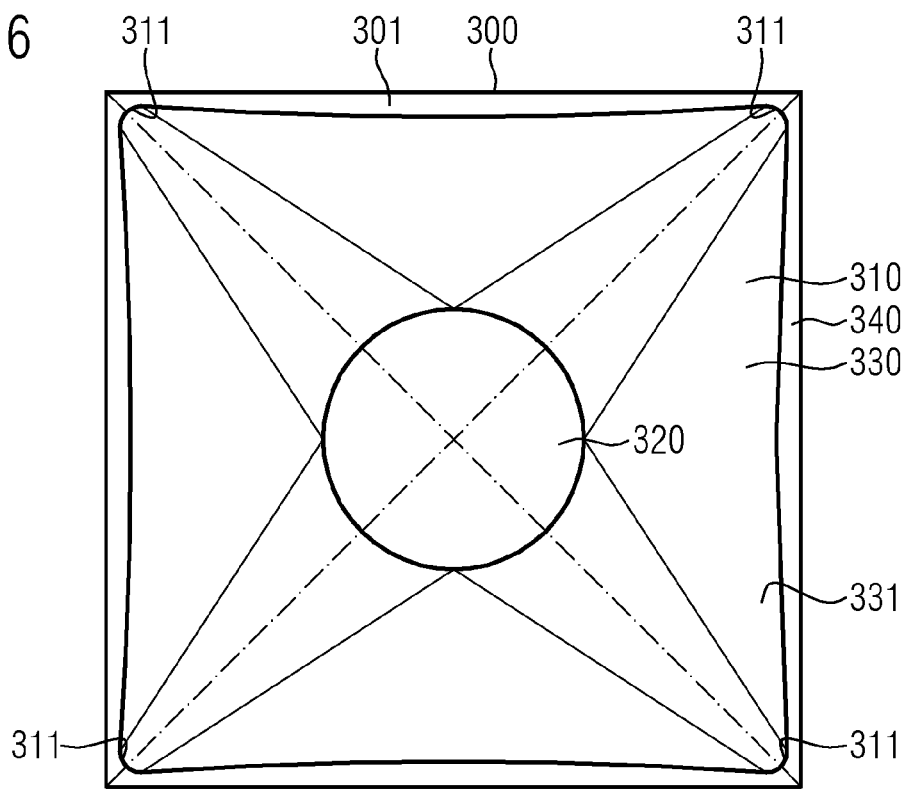
FIG. 6 shows a plan view of an upper opening of the reflector.

FIG. 5 shows a schematic plan view of the lower opening 320 at the underside 302 of the reflector 300. FIG. 6 shows a schematic plan view of the upper opening 310 at the top side 301 of the reflector 300. FIG. 4 shows a schematic perspective illustration of the wall 331 of the through opening 330 of the reflector 300, said through opening extending between the lower opening 320 and the upper opening 310, without the other parts of the reflector.

The wall 331 of the through opening 330 is configured such that the shape of the lower opening 320 is converted into the shape of the upper opening 310, without the wall 331 having sharp edges or bends. At the same time the wall 331 of the through opening 330 is curved in such a way that the empty space of the through opening 330 of the reflector 300 has a convex shape. The wall 331 of the through opening 330 is thus curved concavely. For this purpose, the shape of the wall 331 can be modeled using directrices, for example.

The lower opening 320 has a circular disk shape in the example shown in FIGS. 3 to 6. A cushion shape or an elliptic shape would also be possible, however. If the lower opening 320 has a cushion shape, then the corners of the lower opening 320 are expediently rounded and oriented toward the corners of the underside 302 of the reflector 300.

In the example shown in the figures, the upper opening 310 of the reflector 300 has a cushion shape with rounded corners 311. In this case, the rounded corners 311 of the cushion-shaped upper opening 310 are oriented toward the corners of the top side 301 of the reflector 300. Alternatively, the upper opening 310 of the reflector 300 can have a square shape. In this case, too, it is expedient if the corners of the upper opening 310 are rounded in order that the wall 331 of the through opening 330 can be embodied without sharp edges and bends.

In the example shown in FIGS. 3 to 6, the top side 301 and the underside 302 of the reflector 300 are each embodied in square fashion. The lower opening 320 and the upper opening 310 each have a quadrant-symmetrical shape. That means that the top side 301 with the upper opening 310 and the underside 302 with the lower opening 320 are each embodied mirror-symmetrically with respect to mirrorings at the side center bisectors and also mirror-symmetrically with respect to mirrorings at the diagonals. As a result of the quadrant-symmetrical configuration of the underside 302 with the lower opening 320 and the top side 301 with the upper opening 310, the through opening 330 with the wall 331 is also embodied quadrant-symmetrically. However, it is likewise possible, for example, for the reflector 300 to be embodied only mirror-symmetrically with respect to mirrorings at two mutually perpendicular planes. In this case, the lower opening 320 of the reflector 300 can have an elliptic shape, for example. Other shapes and symmetries are also possible.

The top side 301 and the underside 302 of the reflector 300 can each have edge lengths of 12.5 mm, for example. The lower opening 320 can have a diameter of 4.69 mm, for example. The upper opening 310 can have a width of 12.26 mm, for example. The cushion shape of the upper opening 310 can be manifested for example in such a way that the peripheral edge 240 has a maximum width of 0.33 mm. The rounded corners 311 of the upper opening 310 can have a radius of 0.23 mm, for example.

As illustrated in FIG. 1, the reflector 300 is arranged at the top side 101 of the carrier 100 in such a way that the underside 302 of the reflector 300 faces the top side 101 of the carrier 100. The optoelectronic semiconductor chip arrangement 200 is arranged at the top side 101 of the carrier 100 in such a way that the underside 202 of the optoelectronic semiconductor chip arrangement 200 faces the top side 101 of the carrier 100. In this case, the optoelectronic semiconductor chip arrangement 200 is arranged in the through opening 330 of the reflector 300. It is expedient if the lower opening 320 at the underside 302 of the reflector 300 is dimensioned such that only a small distance remains between the optoelectronic semiconductor chip arrangement 200 and the edge of the lower opening 320 of the reflector 300. What is achieved as a result is that only a small portion of the top side 101 of the carrier 100 is not covered in the region below the lower opening 320 of the reflector 300.

The LED backlighting system 10 furthermore comprises a diffuser element 400 having a top side 401 and an underside 402 opposite the top side 401. The diffuser element 400 is arranged over the top side 301 of the reflector 300 in such a way that the underside 402 of the diffuser element 400 faces the top side 301 of the reflector 300. The diffuser element 400 is thus arranged over the upper opening 310 of the reflector 300. The underside 402 of the diffuser element 400 can have a peripheral edge 403 bearing on the peripheral edge 340 at the top side 301 of the reflector 300.

The diffuser element 400 is provided for diffusely scattering light that has been generated by the optoelectronic semiconductor chip arrangement 200 and emerges through the upper opening 310 of the reflector 300. For this purpose, the diffuser element 400 comprises a substantially transparent matrix material 410 and diffuser particles 415 embedded into the matrix material 410. The matrix material 410 can be for example PMMA, a polycarbonate, a silicone or an epoxy. The diffuser particles 415 can comprise $Al_2O_3$, $TiO_2$ or $SiO_2$, for example. Optionally, the diffuser element 400 can additionally comprise embedded wavelength-converting particles. The diffuser element 400 can be produced by an injection molding method, for example.

Figure 7:
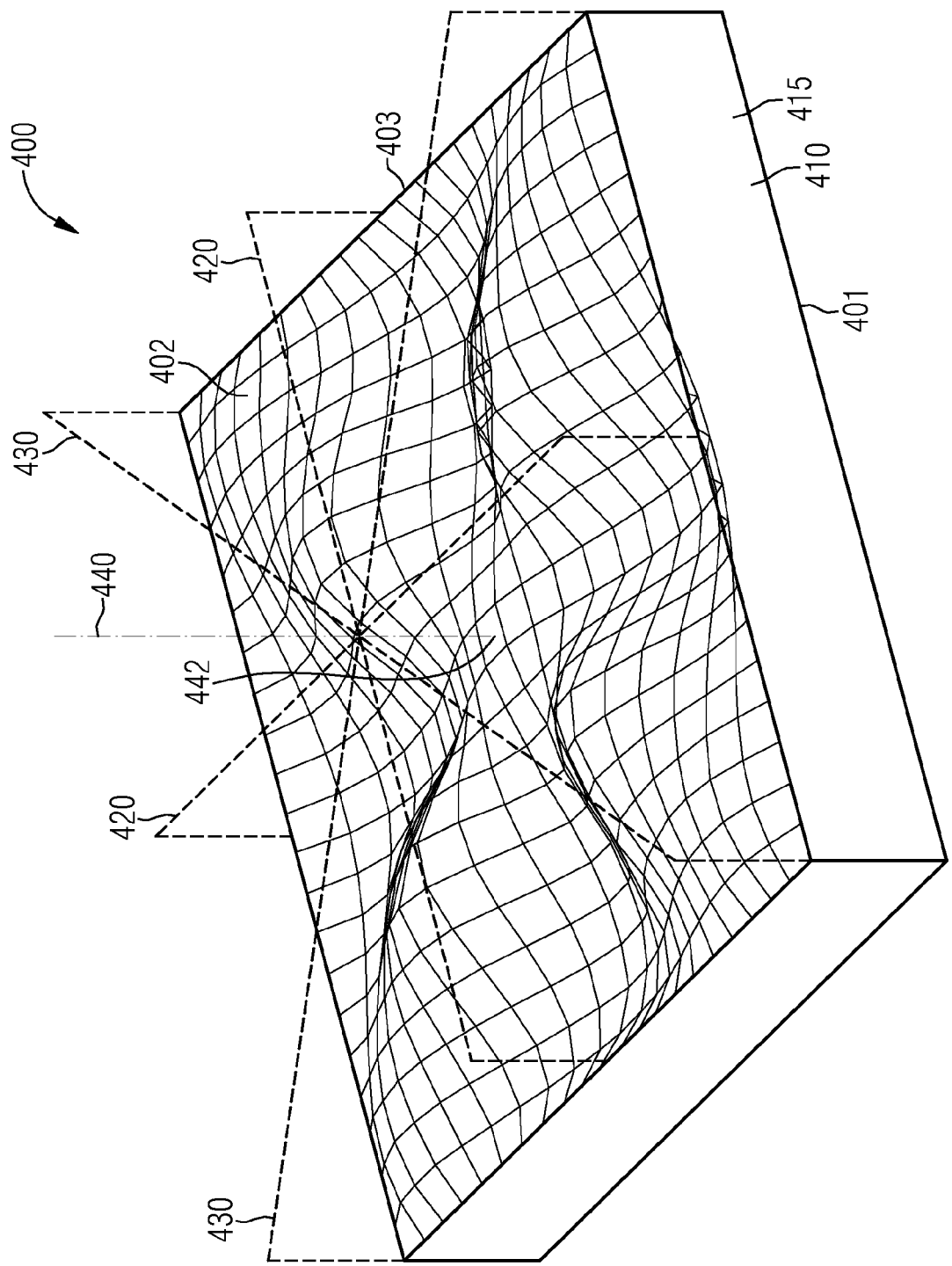
FIG. 7 shows a perspective illustration of a first variant of a diffuser element of the LED backlighting system.

FIG. 7 shows a schematic perspective illustration of a first variant of the diffuser element 400. In the example illustrated, the top side 401 and the underside 402 of the diffuser element 400 are embodied in square fashion and have the same external dimensions as the top side 301 and the underside 302 of the reflector 300.

The underside 402 of the diffuser element 400 is visible in FIG. 7. The underside 402 is embodied as a freeform surface and has a topography with elevations and depressions. The top side 401 of the diffuser element 400 is embodied as a plane surface in the example illustrated. Alternatively, it would be possible for the top side 401 of the diffuser element 400 to be embodied as a freeform surface with elevations and depressions. In this case, the underside 402 of the diffuser element 400 can be embodied in plane fashion or likewise as a freeform surface.

FIG. 7 depicts a center axis 440 of the diffuser element 400, said center axis extending through a central point 441 of the top side 401 and through a central point 442 of the underside 402 of the diffuser element 400. The center axis 440 is thus oriented perpendicular to the plane top side 401 of the diffuser element 400. FIG. 7 additionally depicts two diagonal planes 430 extending in each case through two mutually opposite corners of the top side 401 and two mutually opposite corners of the underside 402 of the diffuser element 400. Furthermore, two side center planes 420 are depicted, which intersect the outer sides of the diffuser element 400 in each case centrally and perpendicularly. The diagonal planes 430 and the side center planes 420 all intersect at the center axis 440.

Since the underside 402 of the diffuser element 400 is embodied as a freeform surface with elevations and depressions, a thickness of the diffuser element 400 measured between the underside 402 of the diffuser element 400 and the top side 401 of the diffuser element 400 and parallel to the center axis 440 has different values in different regions of the diffuser element 400. The diffuser element 400 is thus thicker at some locations and thinner at some locations. This results in a locally different optical path length within the diffuser element 400 and hence in a locally different scattering effect of the diffuser element 400. Light penetrating into the diffuser element 400 in a region of higher thickness is scattered to a greater extent than light penetrating into the diffuser element 400 in a region of small thickness.

The underside 402 of the diffuser element 400 embodied as a freeform surface is configured such that local differences in luminance of the light emerging at the upper opening 310 of the reflector 300 are at least partly compensated for by the diffuser element 400. For this purpose, the diffuser element 400 has a higher thickness in regions of high luminance than in regions of lower luminance. Since the symmetry of the luminance distribution of the light emerging from the reflector 300 at the upper opening 310 corresponds to the symmetry of the through opening 330 of the reflector 300, it is expedient for the diffuser element 400 to have the same symmetry as the reflector 300.

Figure 8:
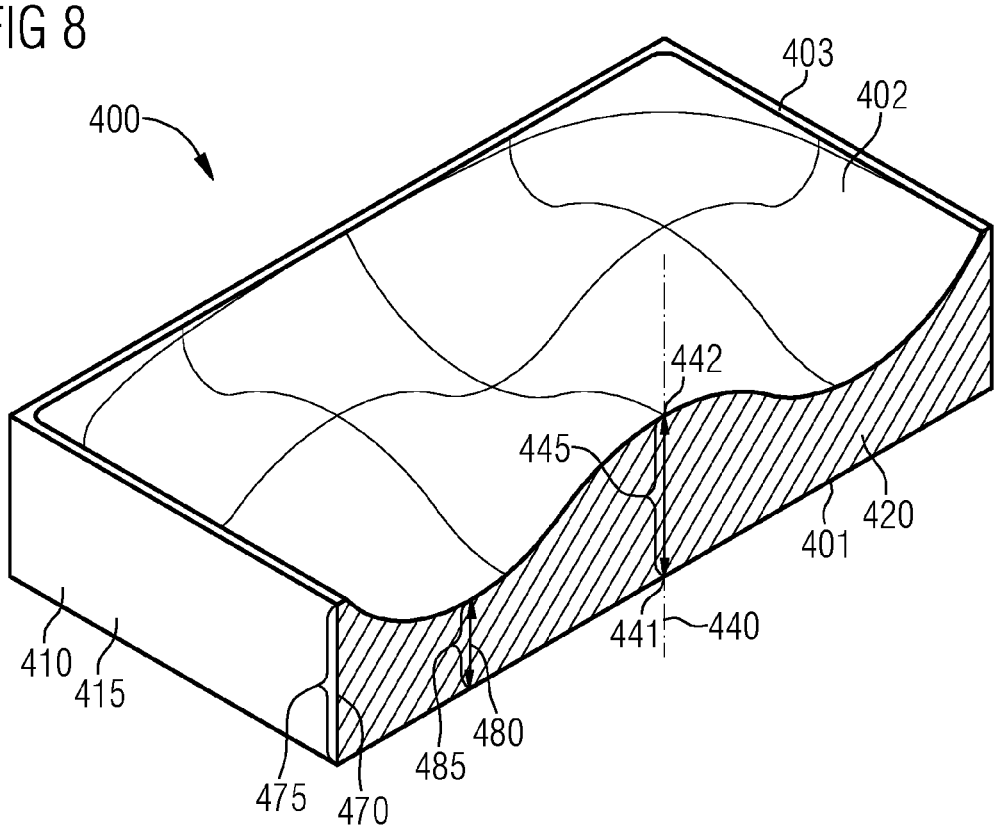
FIG. 8 shows a first section through said diffuser element.
Figure 9:
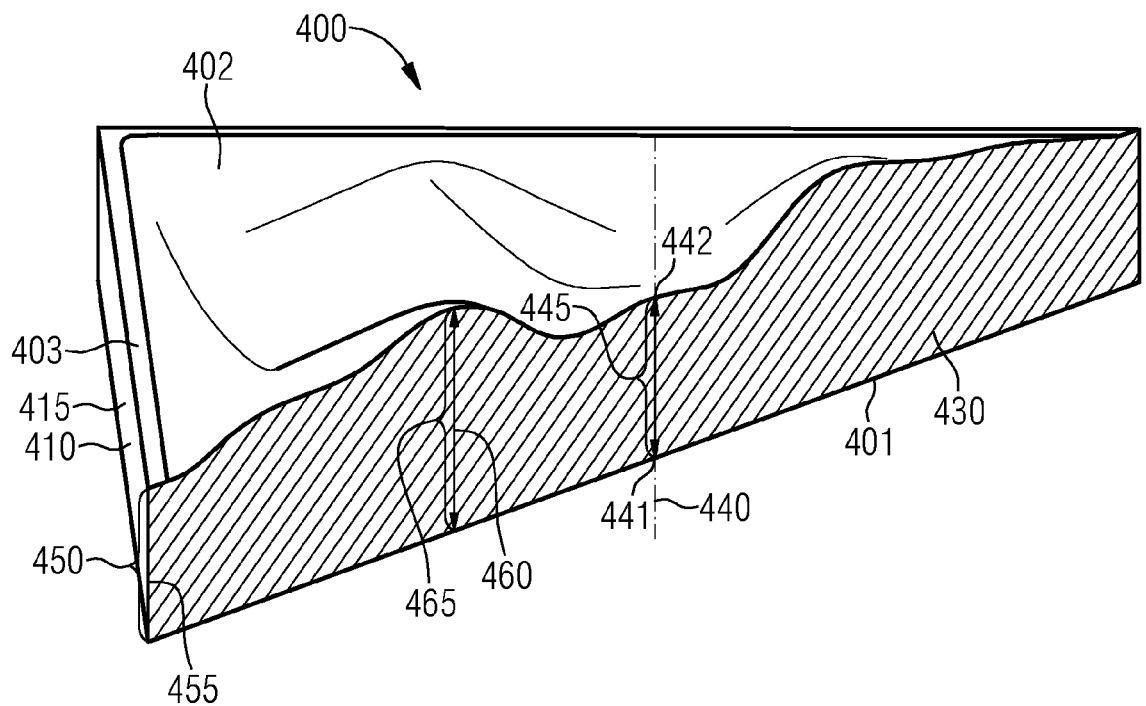
FIG. 9 shows a second section through said diffuser element.

FIG. 8 shows a sectional view—at one of the side center planes 420—of the variant of the diffuser element 400 shown in FIG. 7. FIG. 9 shows a sectional view—at one of the diagonal planes 430—of the variant of the diffuser element 400 shown in FIG. 7. FIGS. 8 and 9 each depict a thickness 445 of the diffuser element 400 at the center axis 440 of the diffuser element 400. FIG. 8 additionally depicts a thickness 475 of the diffuser element 400 in an edge region 470 of the diffuser element 400 in which the side center plane 420 intersects one of the outer sides of the diffuser element 400. FIG. 8 additionally depicts a thickness 485 of the diffuser element 400 at a location 480 on the side center plane 420 that is situated between the edge region 470 and the center axis 440. FIG. 9 depicts a thickness 455 in a corner region 450 of the diffuser element 400. FIG. 9 additionally depicts a thickness 465 at a location 460 on the diagonal plane 430 that is situated between the corner region 450 and the center axis 440.

The elevations and depressions of the underside 402—embodied as a freeform surface—of the variant of the diffuser element 400 shown in FIGS. 7 to 9 are configured such that the thickness 485 at the location 480 on the side center plane 420 that is situated between the edge region 470 and the center axis 440 is smaller than the thickness 445 at the center axis 440. The thickness 485 at said location 480 is additionally smaller than the thickness 475 in the edge region 470 of the diffuser element 400. The thickness 465 at the location 460 on the diagonal plane 430 that is situated between the corner region 450 and the center axis 440 is larger than the thickness 445 at the center axis 440. The thickness 465 at said location 460 is additionally also larger than the thickness 455 in the corner region 450 of the diffuser element 400.

Figure 10:
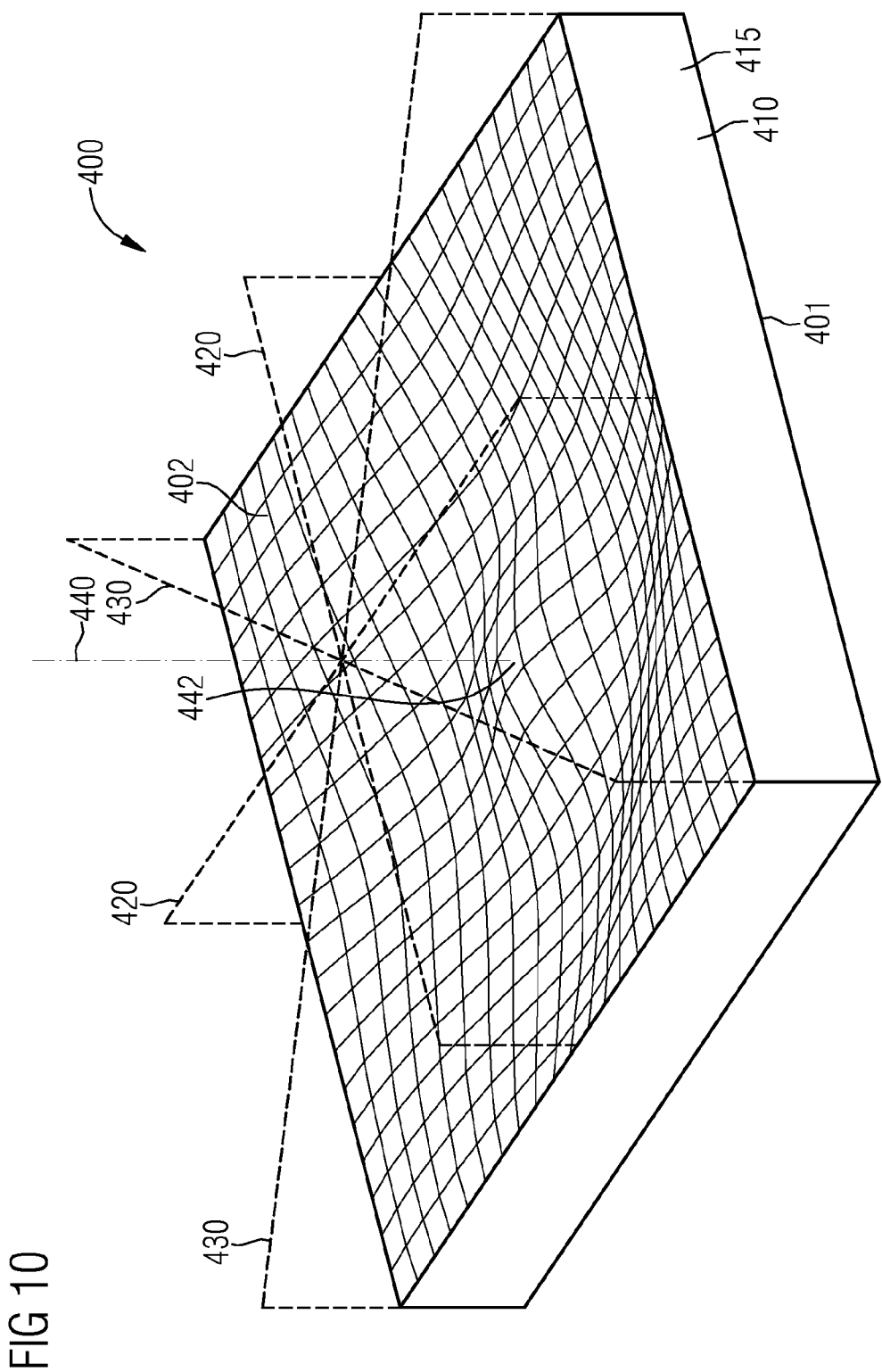
FIG. 10 shows a perspective view of a second variant of the diffuser element.
Figure 11:
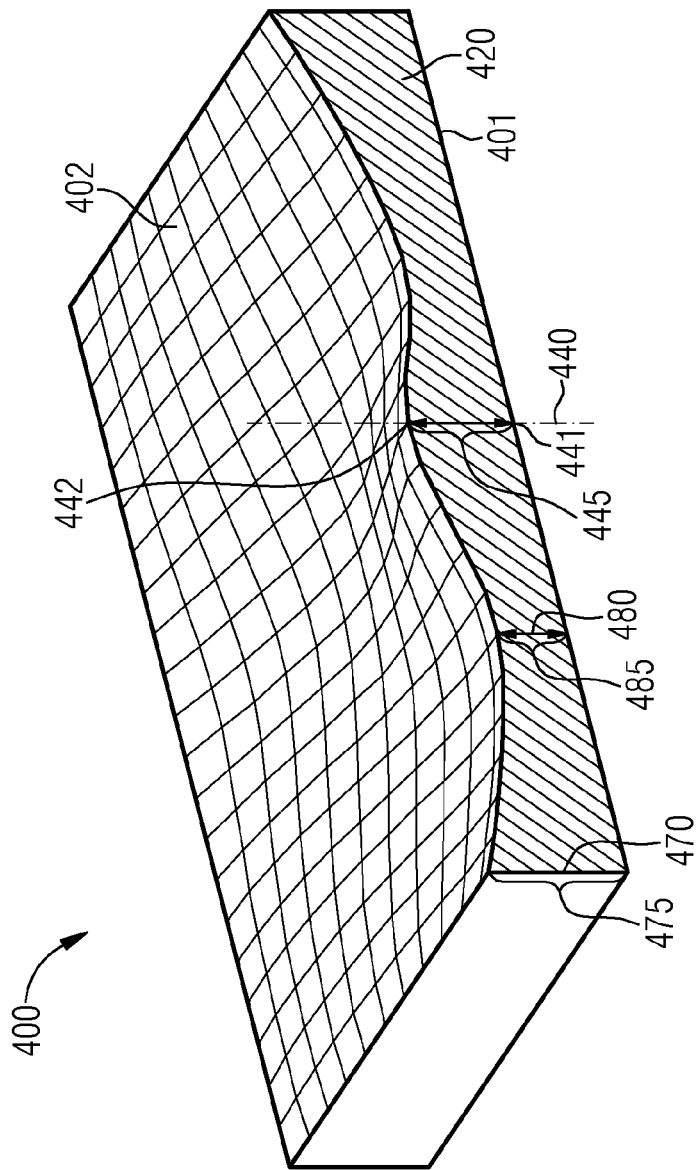
FIG. 11 shows a section through said diffuser element.

FIG. 10 shows a schematic perspective illustration of a second variant of the diffuser element 400. In the case of this variant of the diffuser element 400, the underside 402—embodied as a freeform surface—of the diffuser element 400 is configured somewhat differently than in the case of the first variant shown in FIGS. 7 to 9. FIG. 11 shows an illustration of the second variant of the diffuser element 400, which illustration is a sectional illustration at one of the side center planes 420.

In the case of the second variant of the diffuser element 400, the underside 402 has a central elevation centered around the center axis 440 and enclosed by a ring-shaped depression. Said depression is in turn enclosed by an elevation adjoining the corner regions 450 and the edge regions 470. As a result, in the case, too, of the second variant of the diffuser element 400 shown in FIGS. 10 and 11, the thickness 485 at the location 480 on the side center plane 420 that is situated between the edge region 470 and the center axis 440 is smaller than the thickness 445 at the center axis 440. The thickness 485 at said location 480 is additionally smaller than the thickness 475 in the edge region 470. Moreover, in the case, too, of the second variant of the diffuser element 400, the thickness 465 at the location 460 situated between the corner region 450 and the center axis 440 on the diagonal plane 430 is higher than the thickness 445 at the center axis 440.

Figure 12:
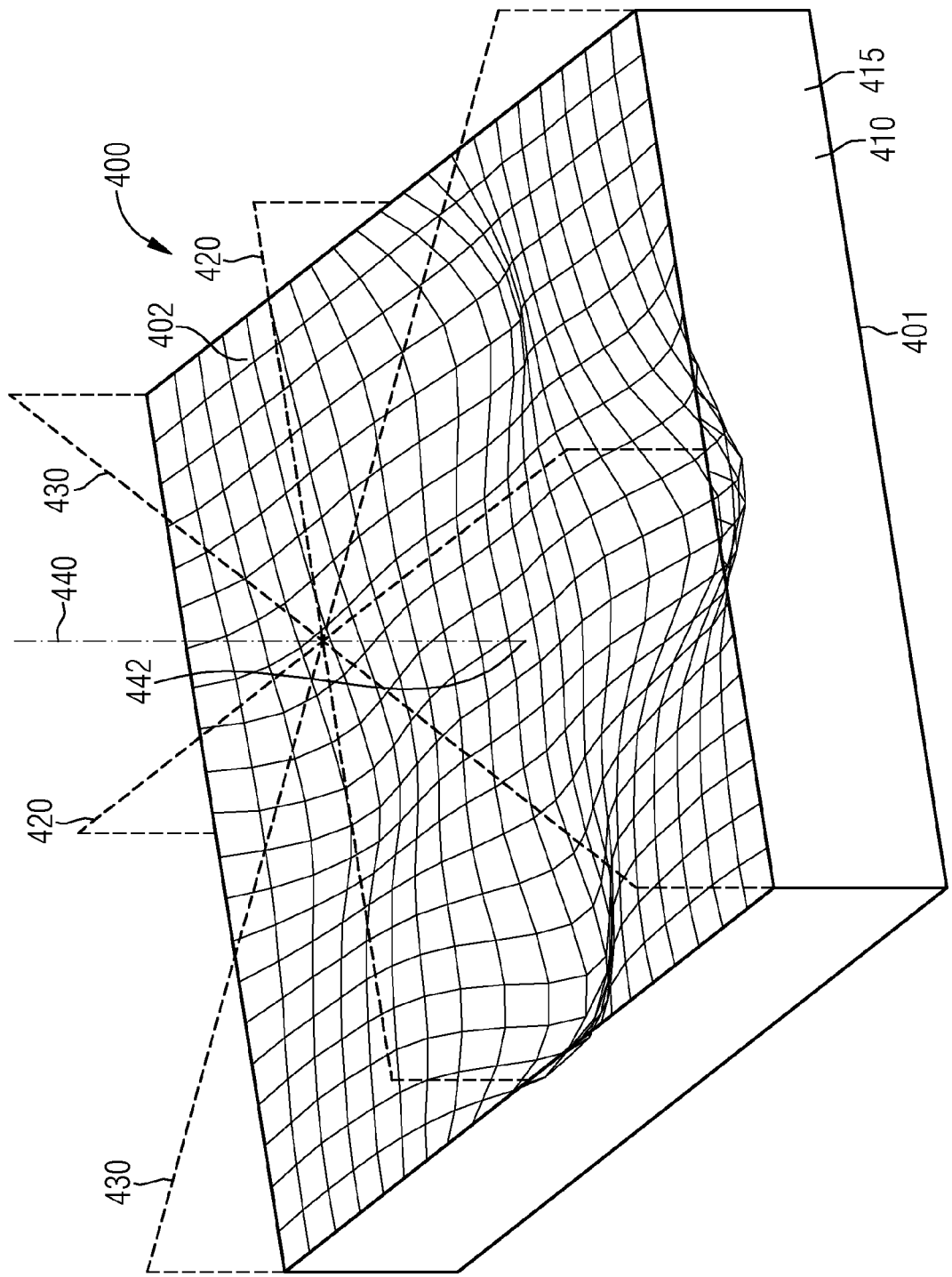
FIG. 12 shows a perspective view of a third variant of the diffuser element.
Figure 13:
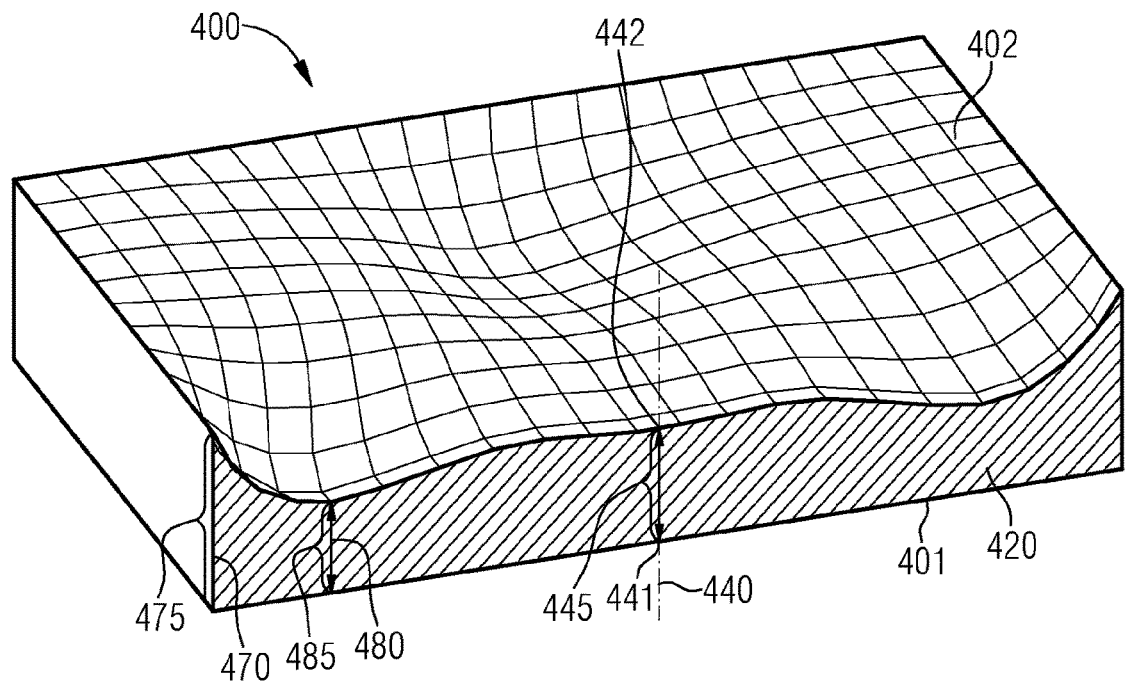
FIG. 13 shows a first section through said diffuser element.
Figure 14:
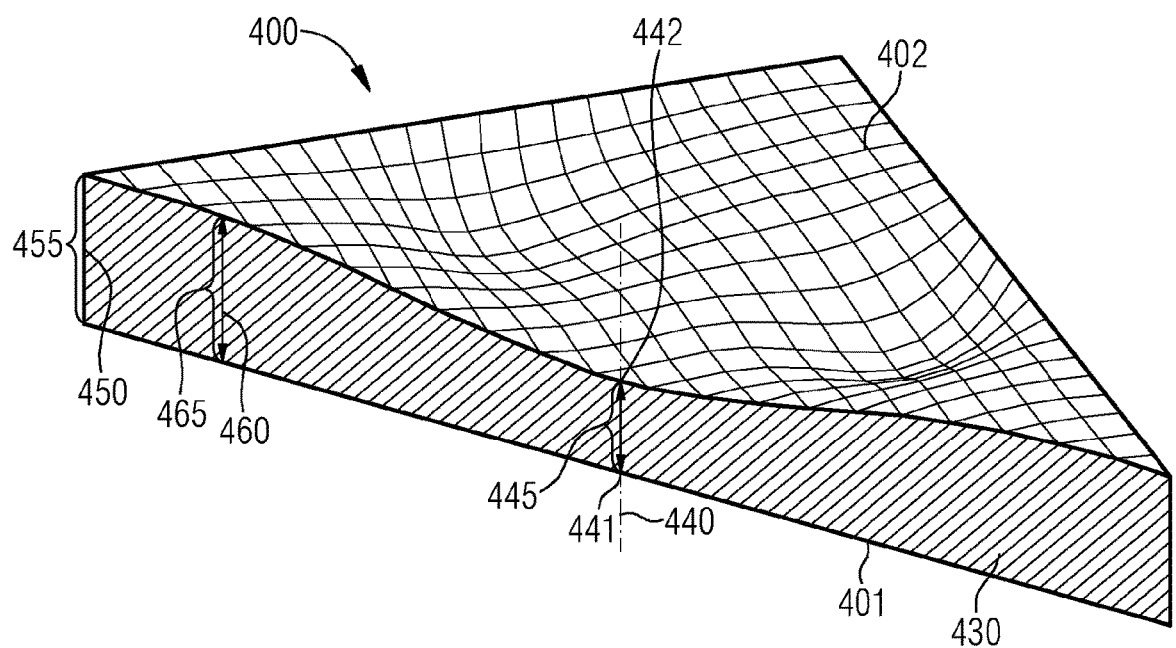
FIG. 14 shows a second section through said diffuser element.

FIG. 12 shows a schematic perspective illustration of a third variant of the diffuser element 400. In the case of the third variant of the diffuser element 400, the underside 402—configured as a freeform surface—of the diffuser element 400 has a different shape than in the case of the first variant and in the case of the second variant of the diffuser element 400. FIG. 13 shows an illustration of the third variant of the diffuser element 400, which illustration is a sectional illustration at one of the side center planes 420. FIG. 14 shows an illustration of the third variant of the diffuser element 400, which illustration is a sectional illustration at one of the diagonal planes 430.

FIG. 13 shows that in the case, too, of the third variant of the diffuser element 400, the thickness 485 at the location 480 situated between the edge region 470 and the center axis 440 on the side center plane 420 is smaller than the thickness 445 at the center axis 440. The thickness 485 at said location 480 is additionally also smaller than the thickness 475 of the diffuser element 400 in the edge region 470. FIG. 14 shows that in the case, too, of the third variant of the diffuser element 400, the thickness 465 at the location 460 situated between the corner region 450 and the center axis 440 on the diagonal plane 430 is larger than the thickness 445 at the center axis 440 of the diffuser element 400. The thickness 465 at said location 460 is additionally also larger than the thickness 455 in the corner region 450 of the diffuser element 400.

Figure 15:
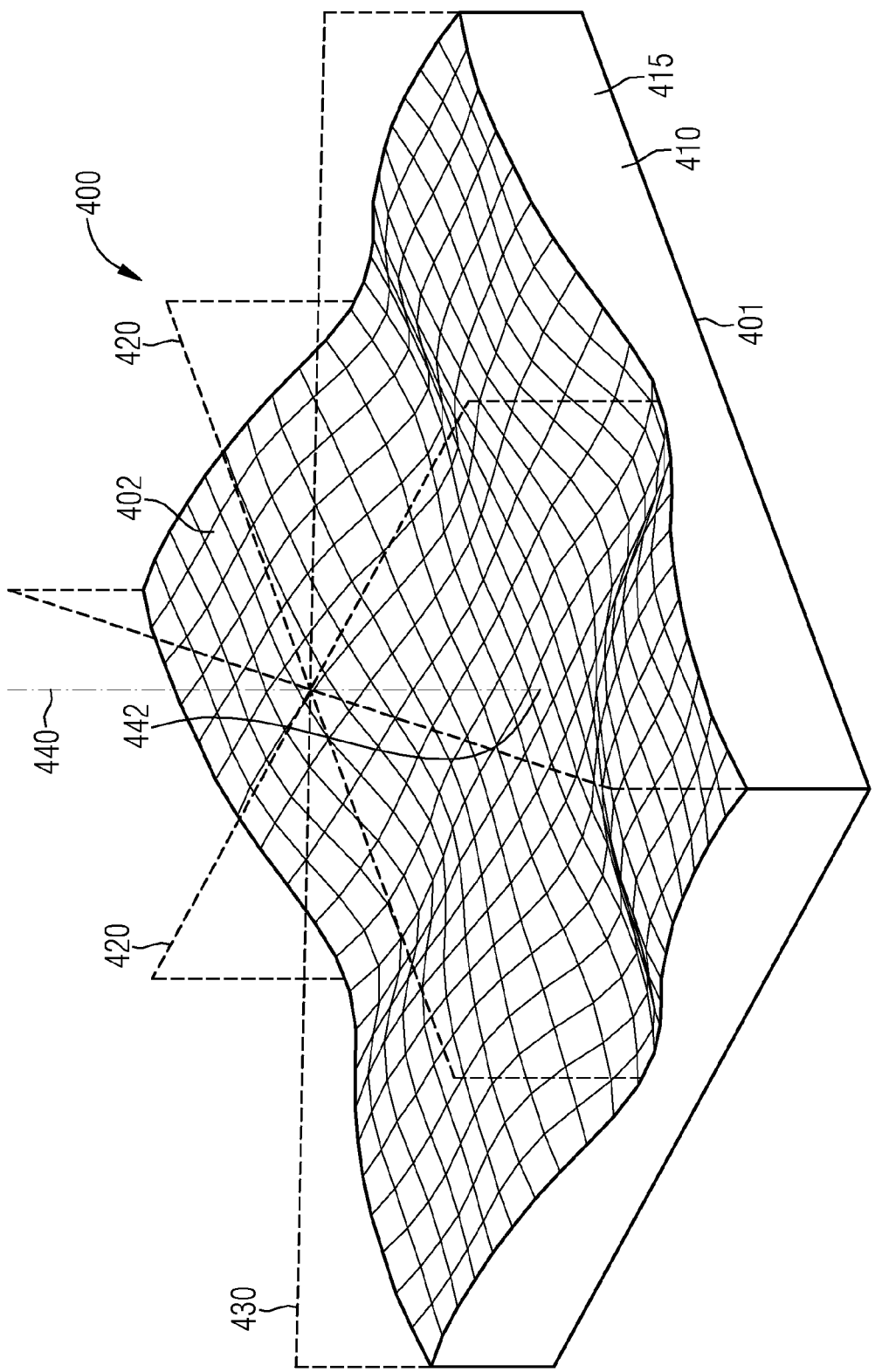
FIG. 15 shows a perspective view of a fourth variant of the diffuser element.
Figure 16:
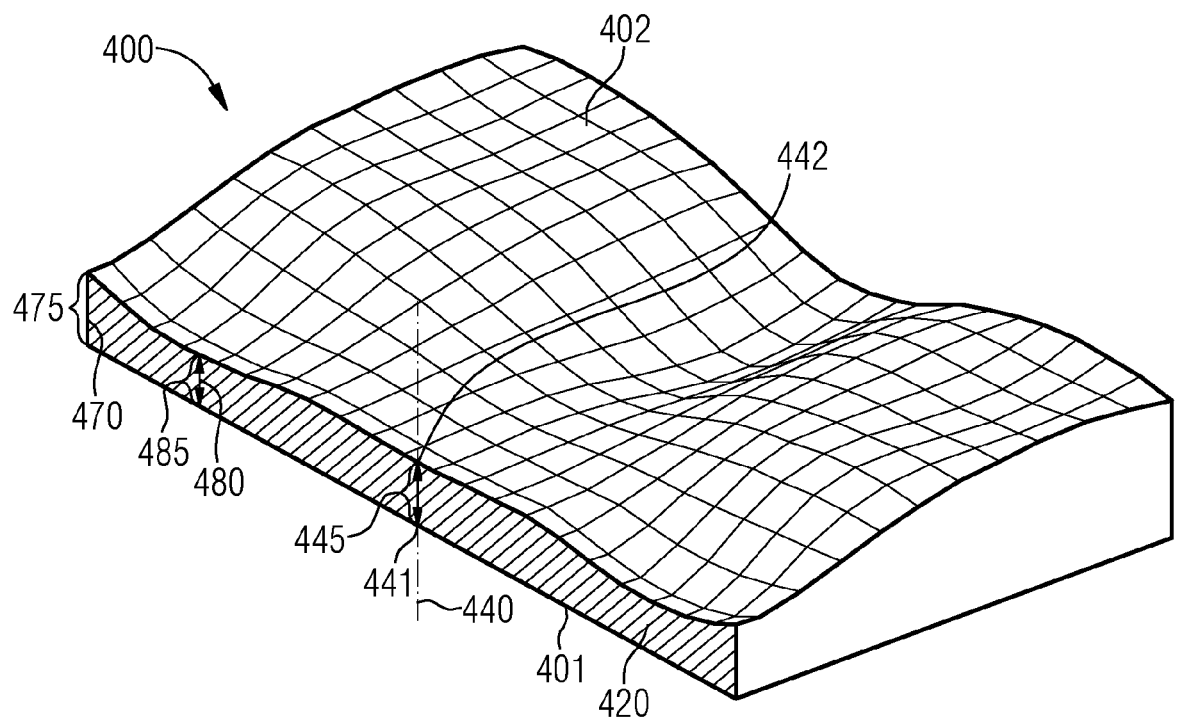
FIG. 16 shows a first section through said diffuser element.
Figure 17:
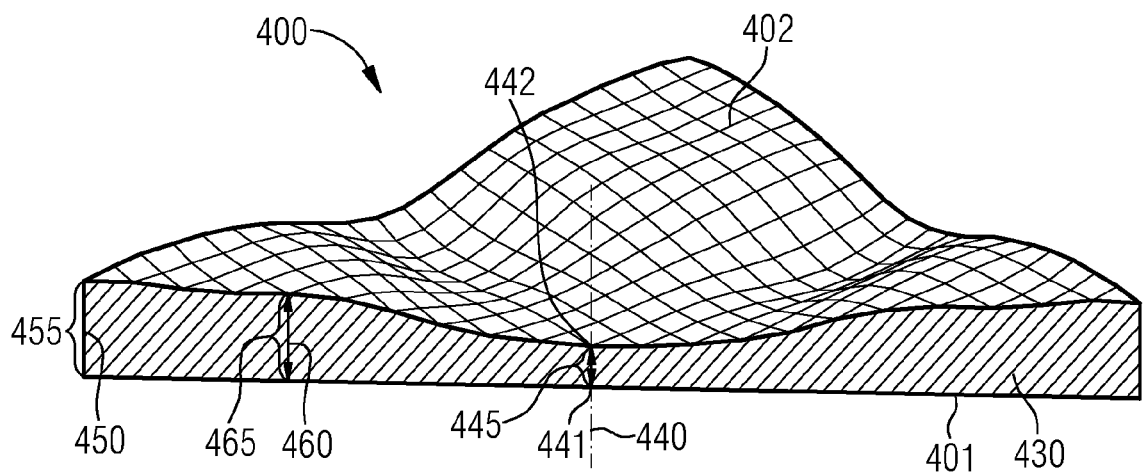
FIG. 17 shows a second section through said diffuser element.

FIG. 15 shows a schematic perspective illustration of a fourth variant of the diffuser element 400. In the case of the fourth variant of the diffuser element 400, the underside 402—embodied as a freeform surface—of the diffuser element 400 is configured differently than in the case of the first variant, the second variant and the third variant of the diffuser element 400. FIG. 16 shows an illustration of the fourth variant of the diffuser element 400, which illustration is a sectional illustration at one of the side center planes 420. FIG. 17 shows an illustration of the fourth variant of the diffuser element 400, which illustration is a sectional illustration at one of the diagonal planes 430.

FIG. 16 shows that in the case, too, of the fourth variant of the diffuser element 400, the thickness 485 at the location 480 situated between the edge region 470 and the center axis 440 on the side center plane 420 is smaller than the thickness 445 at the center axis 440. The thickness 485 at said location 480 is additionally also smaller than the thickness 475 in the edge region 470 of the diffuser element 400. FIG. 17 shows that in the case, too, of the fourth variant of the diffuser element 400, the thickness 465 at the location 460 situated between the corner region 450 and the center axis 440 is larger than the thickness 445 at the center axis 440 of the diffuser element 400. Moreover, the thickness 465 at said location 460 is larger than the thickness 455 in the corner region 450 of the diffuser element 400.

It goes without saying that other configurations of the diffuser element 400 are also possible.

FIG. 1 shows that the LED backlighting system 10 comprises a film stack 600 arranged at the top side 401 of the diffuser element 400. The film stack 600 can comprise one or more films, which can be provided for example for polarizing the light emitted by the LED backlighting system 10. In this case, the films of the film stack 600 can be embodied such that light that does not have the desired polarization direction is reflected and recycled within the film stack 600. The films of the film stack 600 can be embodied for example as Brightness Enhancement Film (BEF) and/or as Dual Brightness Enhancement Film (DBEF).

Figure 18:
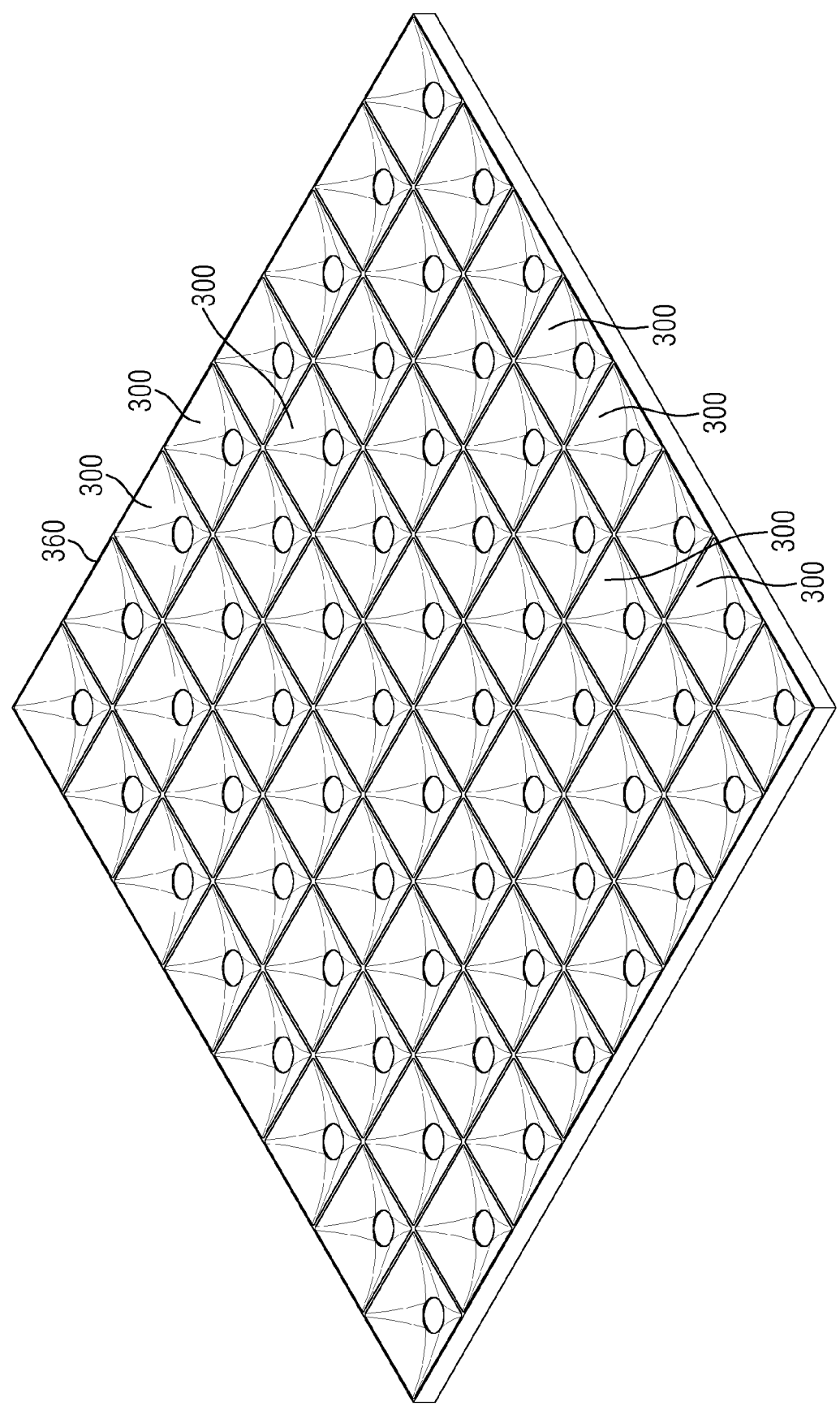
FIG. 18 shows a perspective illustration of a reflector assemblage.

FIG. 18 shows a schematic perspective illustration of a reflector assemblage 360. The reflector assemblage 360 comprises a plurality of reflectors 300, each of which is embodied as described above with reference to FIGS. 3 to 6. In the reflector assemblage 360, the reflectors are arranged in a regular matrix arrangement and connected to one another integrally in a continuous fashion. In the example shown in FIG. 18, the reflector assemblage 360 comprises 8×8 reflectors 300. However, the reflector assemblage 360 can also be embodied with a different number of reflectors 300.

Figure 19:
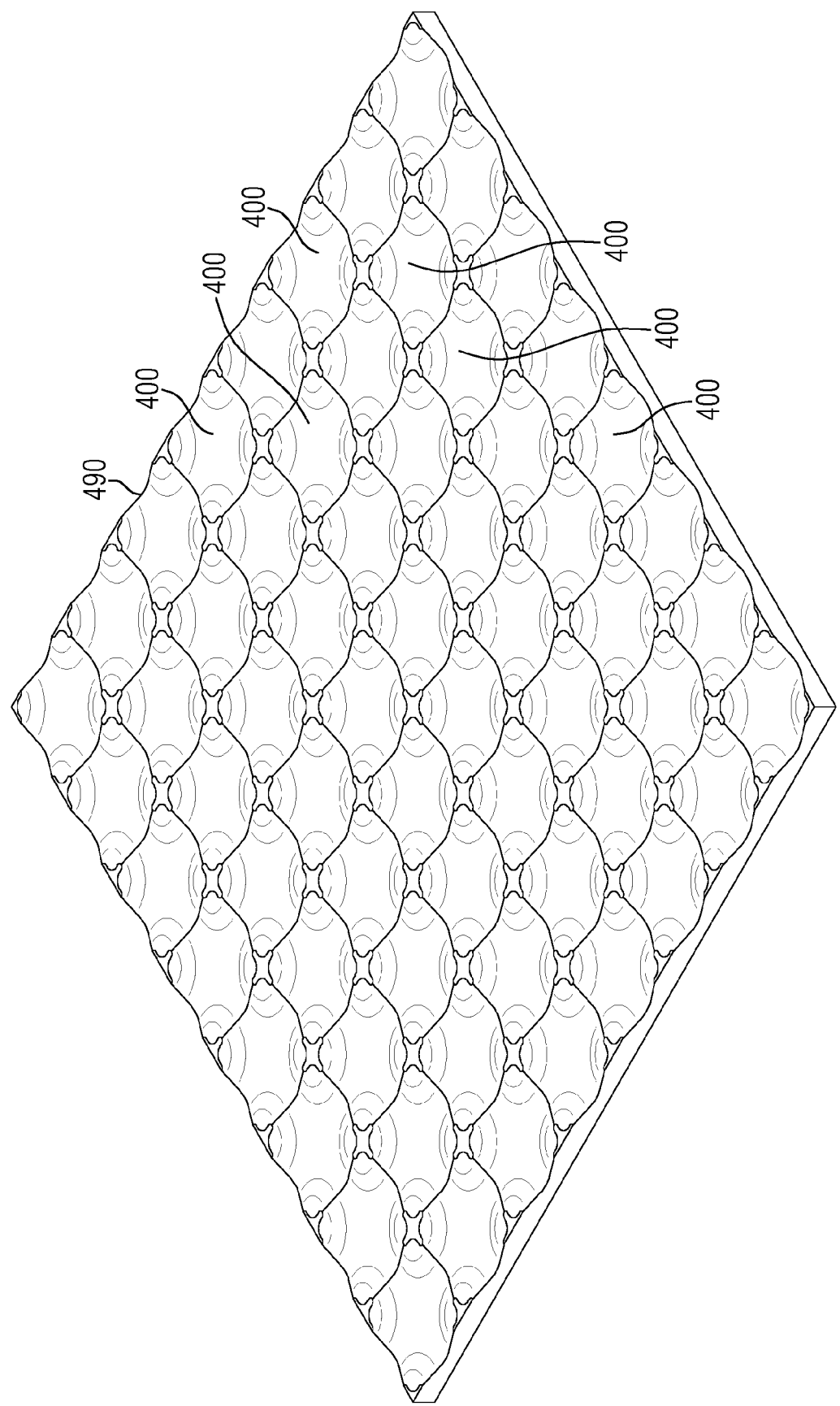
FIG. 19 shows a perspective illustration of a diffuser assemblage.

FIG. 19 shows a schematic perspective illustration of a diffuser assemblage 490. The diffuser assemblage 490 comprises a plurality of diffuser elements 400, each of which is embodied as described above with reference to FIGS. 7 to 17. In this case, in the diffuser assemblage 490, the individual diffuser elements 400 are arranged integrally in a continuous fashion in a regular matrix arrangement. In the example shown in FIG. 19, the diffuser assemblage 490 comprises 8×8 diffuser elements 400. A different number of diffuser elements 400 is likewise possible, however.

The LED backlighting system 10 can be embodied with a plurality of the unit cells shown in FIG. 1. The reflector assemblage 360 shown in FIG. 18 and the diffuser assemblage 490 shown in FIG. 19 are used for this purpose. In this case, an optoelectronic semiconductor chip arrangement 200 is arranged in the through opening 330 of each reflector 300 of the reflector assemblage 360. The carrier 100 and the film stack 600 each have a size adapted to the size of the reflector assemblage 360 and of the diffuser assemblage 490. By varying the number of unit cells of the LED backlighting system 10, it is possible for the size of the LED backlighting system 10 to be scaled to a desired size.

Figure 20:
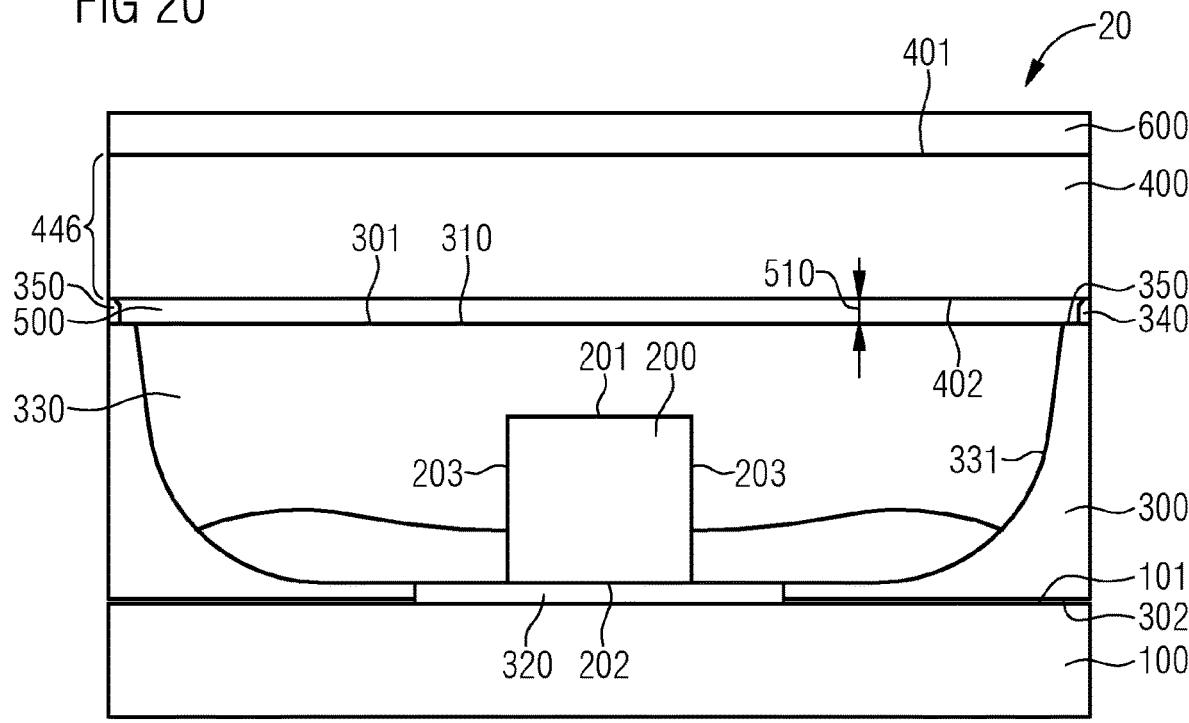
FIG. 20 shows a sectional side view of a second variant of the LED backlighting system.

FIG. 20 shows a schematic sectional side view of an LED backlighting system 20 in accordance with a second variant. Once again only one unit cell of the LED backlighting system 20 is shown in FIG. 20. However, the LED backlighting system 20 can comprise a plurality of the unit cells shown in FIG. 20, which can be arranged in a matrix-shaped fashion in this case.

The LED backlighting system 20 in FIG. 20 largely corresponds to the LED backlighting system 10 in FIG. 1. Corresponding components in FIG. 20 are provided with the same reference signs as in FIG. 1. All that is described below is how the LED backlighting system 20 in FIG. 20 differs from the LED backlighting system 10 in FIG. 1. For the rest, the above description of the LED backlighting system 10 also applies to the LED backlighting system 20.

Figure 21:
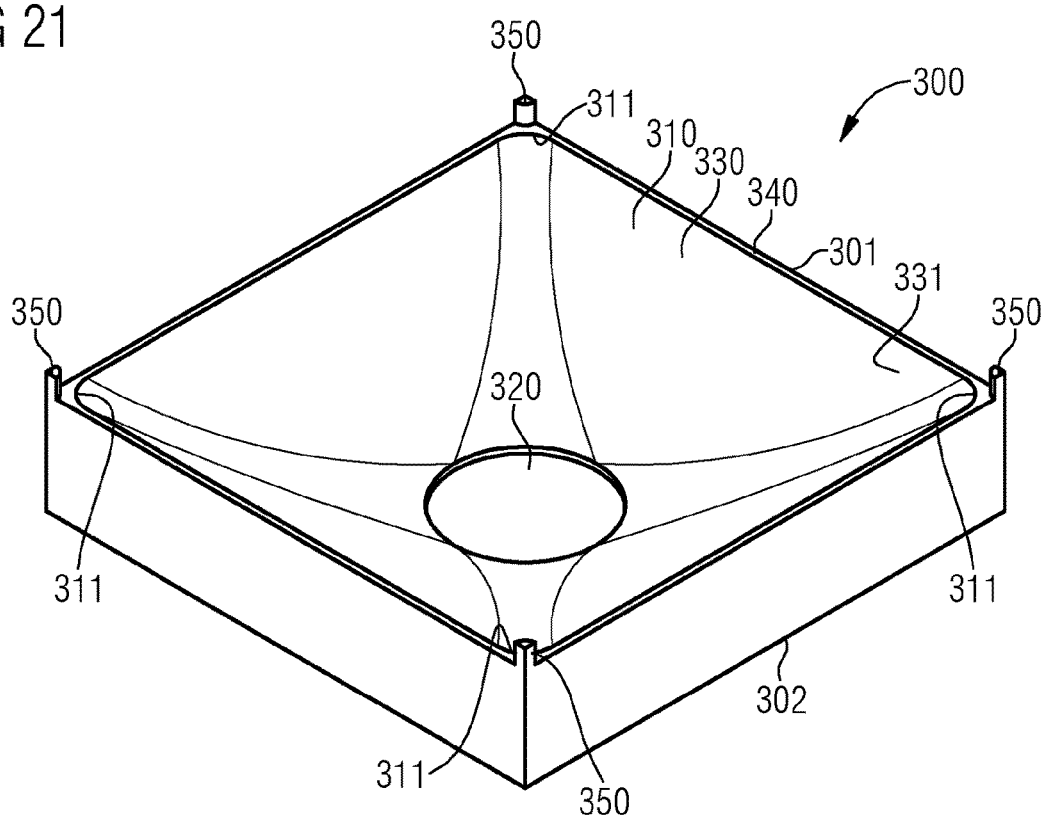
FIG. 21 shows a perspective illustration of the reflector of the second variant of the LED backlighting system.
Figure 22:
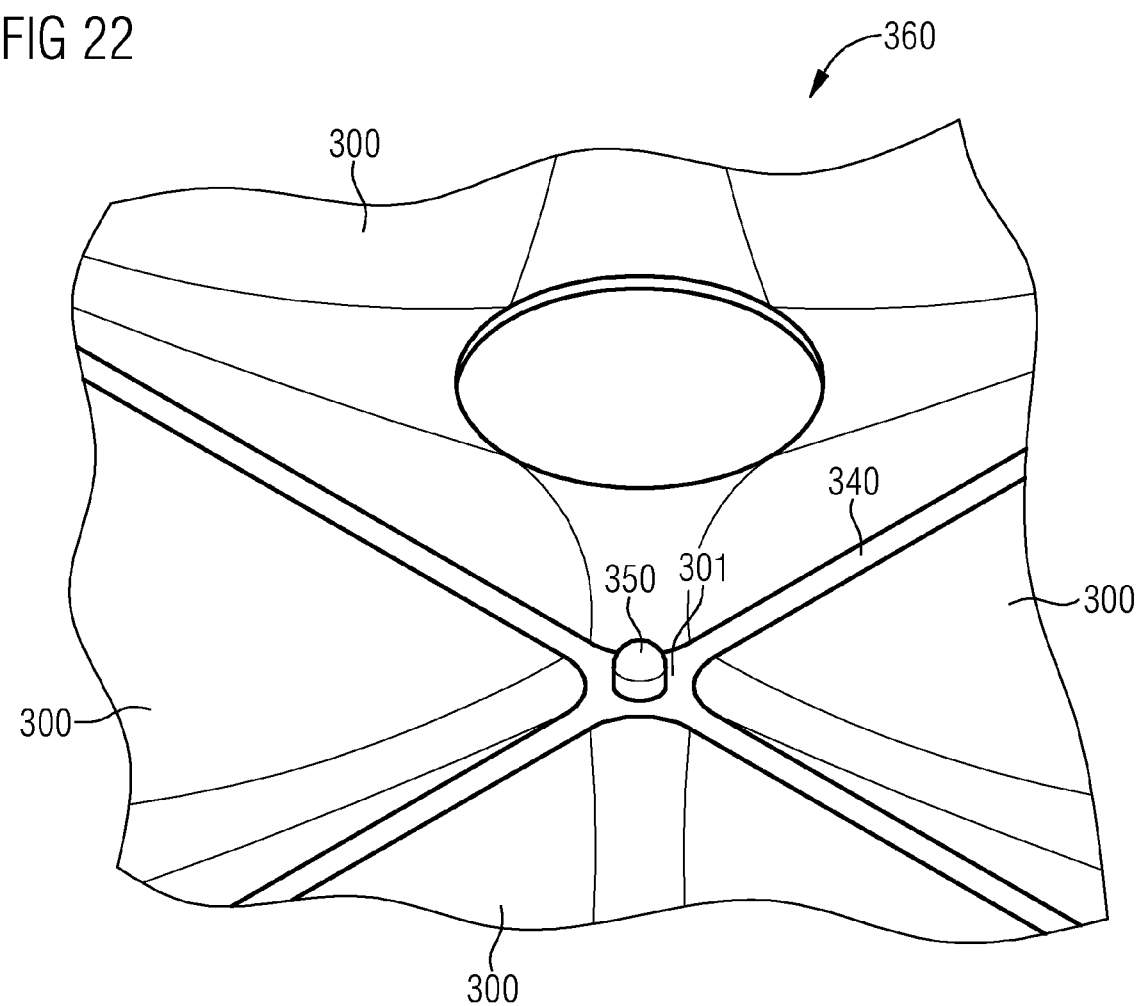
FIG. 22 shows a spacer at the reflector of the second variant of the LED backlighting system.

FIG. 21 shows a schematic perspective illustration of the reflector 300 of the LED backlighting system 20. FIG. 22 shows a detail of the reflector assemblage 360, wherein the reflectors 300 are embodied in each case like the reflector 300 of the LED backlighting system 20.

In the case of the reflector 300 of the LED backlighting system 20, the lower opening 310 can have a diameter of 3.59 mm, for example. The upper opening 310 can have a width of 8.45 mm, for example. The cushion shape of the upper opening 310 can be embodied, for example, in such a way that the peripheral edge 340 has a maximum width of 0.18 mm. In this regard, the edge length of the reflector 300 can be 8.7 mm, for example. The rounded corners 311 of the upper opening 310 of the reflector 300 can be rounded with a radius of 0.6 mm, for example.

FIG. 22 reveals that at each intersection point of in each case four reflectors 300 of the reflector assemblage 360, a spacer 350 is arranged on the peripheral edge 340 at the top side 301 of the reflectors 300. As a result, in the case of each individual reflector 300 at each corner of the top side 301 in each case a spacer 350 is arranged at the peripheral edge 340, as is discernible in FIG. 21. The spacers can each have for example a height of 0.2 mm above the other portions of the peripheral edge 340. A thickness of the reflector 300 measured from the underside 302 as far as the top of the spacers 350 can be 2.69 mm, for example.

FIG. 20 shows that the diffuser element 400 in the case of the LED backlighting system 20 is arranged over the top side 301 of the reflector 300 in such a way that the diffuser element 400 bears against the spacers 350. In the case of the LED backlighting system 20, this results in an air gap 500 between the peripheral edge 340 of the reflector 300 and the underside 402 of the diffuser element 400. A thickness 510 of said air gap 500 corresponds to the height of the spacers 350 and can thus be 0.2 mm, for example.

The diffuser element 400 is embodied as a plane-parallel plate in the case of the LED backlighting system 20 in FIG. 20. In the case of the diffuser element 400 of the LED backlighting system 20, therefore, both the top side 401 and the underside 402 are embodied as a plane surface. The diffuser element 400 of the LED backlighting system 20 thus has a constant thickness 446 in all portions. The constant thickness 446 of the diffuser element 400 can be 1.28 mm, for example.

For the rest, the diffuser element 400 of the LED backlighting system 20 can be embodied like the diffuser element 400 of the LED backlighting system 10. It has proved to be particularly expedient if the matrix material 410 of the diffuser element 400 of the LED backlighting system 20 comprises PMMA and the diffuser particles 415 are embodied as $Al_2O_3$ particles. A proportion constituted by the diffuser particles 415 of 0.25% by weight is expedient in this case. An expedient particle size of the diffuser particles 415 is 0.5 µm.

The air gap 500 of the LED backlighting system 20 embodied between the peripheral edge 340 of the reflector 300 and the underside 402 of the diffuser element 400 advantageously makes it possible for light emerging from the reflector 300 at the upper opening 310 to pass into the region above the peripheral edge 340 of the reflector 300.

In a further variant of the LED backlighting system 20, the diffuser element 400 can be embodied as in the case of the LED backlighting system 10 and have a different thickness in different portions of the diffuser element 400.

The invention has been illustrated and described in more specific detail on the basis of the preferred exemplary embodiments. Nevertheless, the invention is not restricted to the examples disclosed. Rather, other variations can be derived therefrom by the person skilled in the art, without departing from the scope of protection of the invention.

LIST OF REFERENCE SIGNS

10 LED backlighting system
20 LED backlighting system
100 Carrier
101 Top side
200 Optoelectronic semiconductor chip arrangement
201 Top side
202 Underside
203 Side surface
210 Optoelectronic semiconductor chip
220 Leadframe
230 Potting material
240 Wavelength-converting material
250 Primary reflector
300 Reflector
301 Top side
302 Underside
310 Upper opening
311 Rounded corners
320 Lower opening
330 Through opening
331 Wall
340 Peripheral edge
350 Spacer
360 Reflector assemblage
400 Diffuser element
401 Top side
402 Underside
403 Peripheral edge
410 Matrix material
415 Diffuser particles
420 Side center plane
430 Diagonal plane
440 Center axis
441 Central point of the top side
442 Central point of the underside
445 Thickness at center axis
446 Constant thickness
450 Corner region
455 Thickness in the corner region
460 Location on diagonal plane
465 Thickness at location on diagonal plane
470 Edge region
475 Thickness in the edge region
480 Location on side center plane 485 Thickness at location on side center plane
490 Diffuser assemblage
500 Air gap
510 Thickness of the air gap
600 Film stack

The invention claimed is:

1. An LED backlighting system
comprising a carrier, an optoelectronic semiconductor chip arrangement, a reflector and a diffuser element,
wherein the optoelectronic semiconductor chip arrangement is arranged at a top side of the carrier,
wherein the reflector has a through opening extending between a lower opening at an underside of the reflector and an upper opening at a top side of the reflector,
wherein the reflector is arranged at the top side of the carrier,
wherein the underside of the reflector faces the top side of the carrier,
wherein the optoelectronic semiconductor chip arrangement is arranged in the through opening of the reflector,
wherein the diffuser element has a top side and an underside,
wherein the diffuser element is arranged over the top side of the reflector,
wherein the underside of the diffuser element faces the top side of the reflector, and
wherein the underside of the diffuser element is embodied as a freeform surface,
wherein the diffuser element has a center axis ROOM defined by a central point of its top side and a central point of its underside,
wherein a thickness of the diffuser element measured between the underside of the diffuser element and the top side of the diffuser element parallel to the center axis has different values in different regions of the diffuser element,
wherein the thickness of the diffuser element has a larger value at a location along a diagonal plane than at the center axis of the diffuser element.

2. The LED backlighting system as claimed in claim 1, wherein the lower opening of the reflector has a circular disk shape, an elliptic shape or a cushion shape.

3. The LED backlighting system as claimed in claim 1, wherein the upper opening of the reflector has a cushion shape or a square shape,
wherein the upper opening has rounded corners.

4. The LED backlighting system as claimed in claim 1, wherein the reflector has at its top side a peripheral edge extending around the upper opening, and at least one spacer arranged at the peripheral edge,
wherein the diffuser element bears against the spacer, thus resulting in an air gap between the peripheral edge of the reflector and the underside of the diffuser element.

5. The LED backlighting system as claimed in claim 1, wherein the thickness of the diffuser element has a smaller value at a location along a side center plane than at the center axis of the diffuser element.

6. The LED backlighting system as claimed in claim 1, wherein the diffuser element has a same symmetry as the reflector.

7. The LED backlighting system as claimed in claim 1, wherein the underside of the diffuser element has a peripheral edge bearing on the top side of the reflector.

8. The LED backlighting system as claimed in claim 1, wherein the diffuser element comprises embedded diffuser particle comprising $Al_2O_3$, $TiO_2$ or $SiO_2$.

9. The LED backlighting system as claimed in claim 1, wherein the LED backlighting system comprises a film stack arranged at the top side of the diffuser element.

10. The LED backlighting system as claimed in claim 1, wherein the optoelectronic semiconductor chip arrangement has a top side, an underside and a plurality of side surfaces,
wherein the optoelectronic semiconductor chip arrangement is configured to emit at least fifty percent of an emitted luminous power at the side surfaces.

11. The LED backlighting system as claimed in claim 10, wherein the optoelectronic semiconductor chip arrangement comprises an optoelectronic semiconductor chip,
wherein the optoelectronic semiconductor chip is embedded into a wavelength-converting material forming the side surfaces of the optoelectronic semiconductor chip arrangement,
wherein a primary reflector is arranged at a top side of the wavelength-converting material and forms the top side of the optoelectronic semiconductor chip arrangement.

12. The LED backlighting system as claimed in claim 1, wherein the reflector together with further reflectors of identical type forms a continuous reflector assemblage,
wherein the diffuser element together with further diffuser elements of identical type forms a continuous diffuser assemblage,
wherein in each case a further optoelectronic semiconductor chip arrangement of identical type is arranged in the through opening of each further reflector.

13. The LED backlighting system as claimed in claim 1, wherein the top side of the diffuser element is embodied as a plane surface.

* * * * *